United States Patent
Willy

Patent Number: 5,774,480
Date of Patent: Jun. 30, 1998

[54] CYCLIC CODE CHECK BITS GENERATION AND ERROR CORRECTION USING SUM OF REMAINDERS

[75] Inventor: John S. Willy, Pleasanton, Calif.

[73] Assignee: Allied Telesyn International Corporation, Sunnyvale, Calif.

[21] Appl. No.: 541,660

[22] Filed: Oct. 10, 1995

[51] Int. Cl.⁶ .................................................. H03M 13/00
[52] U.S. Cl. ......................................... 371/37.1; 371/37.6
[58] Field of Search ................................ 371/37.1, 37.6, 371/37.8, 47.1, 53; 364/746.1, 764

[56] References Cited

U.S. PATENT DOCUMENTS

| | | | |
|---|---|---|---|
| 4,065,752 | 12/1977 | Goldberg | 371/53 |
| 4,623,999 | 11/1986 | Patterson | 371/37.8 |
| 5,282,215 | 1/1994 | Hyodo et al. | 371/42 |
| 5,402,429 | 3/1995 | Stessens | 371/37.1 |

OTHER PUBLICATIONS

Ramabadran et al., "A Tutorial on CRC Computations", IEEE Micro, Aug. 1988, pp. 62–74.

Johnston et al., "The ATM Layer Chip: An ASIC for B-ISDN Applications", IEEE J. on Selected Areas in Communications, vol. 9, No. 5, pp. 741–750, Jun. 1991.

Maniatopoulos et al., "Single–Bit Error–Correction Circuit for ATM Interfaces", Electronics Letters, vol. 31, No. 8, pp. 617–618, Apr. 1995.

*Primary Examiner*—Stephen M. Baker
*Attorney, Agent, or Firm*—Townsend and Townsend and Crew LLP; Henry K. Woodward

[57] ABSTRACT

Check bits for a cyclic code are generated for a binary integer by first obtaining a remainder value for each bit of the integer resulting from dividing the bits of the integer by a cyclic generator polynomial to obtain a quotient and said remainder. All remainders are then summed modulo 2 to obtain an integer remainder which functions as the cyclic code for the binary integer. An error in a received integer can be identified and corrected by generating new cyclic code check bits for the received integer, and then comparing the new cyclic code check bits to the received cyclic code check bits. Any difference between the two check bits will correspond to the unique remainder for an erroneous bit, which can then be corrected by complementing the bit. If two or more errors are present, an error will be recognized but the specific errors cannot be identified. The integer must then be discarded. In a preferred embodiment the remainder values are added in an exclusive OR circuit in which remainder values for adjacent bits are summed, and adjacent sums are summed to obtain a final remainder value for all bits.

12 Claims, 2 Drawing Sheets

CYCLIC CODE CHECK BITS GENERATION AND ERROR CORRECTION USING SUM OF REMAINDERS

BACKGROUND OF THE INVENTION

This invention relates generally to digital signal transmission, and more particularly the invention relates to cyclic code check bits generation and error correction in transmitted digital signals.

The transmission of digital data in the form of "1" and "0" bits can be degraded by noise. A number of error detection techniques have been devised including the simple parity check and the more powerful cyclic redundancy check which not only detects the presence of an error but also identifies its location.

Asynchronous Transfer Mode (ATM) is a new communications technology for high speed transmission of voice, video and data using multiplexing and switching services. Data are transmitted in 53-byte cells with each cell having a 40 bit header including a 32 bit address and an 8 bit header error correction field (HEC).

The present invention is directed to a cyclic redundancy check for use with the ATM header, for example, which is easy to implement in code generation and error correction.

SUMMARY OF THE INVENTION

In accordance with the present invention check bits for a cyclic code are generated for a binary integer by first obtaining a unique remainder value for each bit of the integer resulting from dividing the bits of the integer by a cyclic generator polynomial to obtain a quotient and the remainder.

All remainders are then summed modulo 2 to obtain an integer remainder which functions as cyclic code check bits for the binary integer.

An error in a received integer can be identified and corrected by generating new check bits for the received integer, and then comparing the new check bits to the received check bits. Any difference between the two check bits will correspond to the unique remainder for an erroneous bit, which can then be corrected by complementing the bit. If two or more errors are present, an error will be recognized but the specific errors cannot be identified. The integer must then be discarded.

In a preferred embodiment, the remainder values are added in an exclusive OR circuit in which remainder values for adjacent bits are summed, and adjacent sums are then summed to obtain a final remainder value for all bits.

In one application, the 32 bit header for an ATM cell has an 8 bit Header Error Code (HEC) generated in accordance with the invention. After transmitting the ATM cell, the received HEC is assumed to be correct and is compared with the generated check bits for the received 32 bit header. If the check bits agree then no error is present. If a difference value corresponds to a unique remainder, then the bit corresponding to the unique remainder is erroneous and is corrected by complementing the bit. If a difference does not correspond to a unique remainder, two or more errors are present and cannot be specifically identified.

The invention and objects and features thereof will be more readily apparent from the following description and dependent claims when taken with the drawing.

DETAILED DESCRIPTION OF ILLUSTRATIVE EMBODIMENT

The cyclic code check bits generation and error detection in accordance with the invention utilizes the fact that the remainder resulting from dividing an integer by a divisor is equal to the sum of remainders resulting from dividing the individual components of the integer corresponding to each power of a base, C, in the integer. For example, in base 10 if n=521 then there is a $C_n$ for 500, 20, and 1 and an $R_n$500, 20 and 1 so that the remainder of 521/6 is equal to R(500/6)+R(20/6)+R(1/6).

The foregoing can be proved from the division algorithm, N=dQ+R, where N is an integer, d is a divisor, Q is a quotient, and R is the remainder.

From N=dQ+R and $C_0 = dQ_0 + R_0$ $C_1 = dQ_1 + R_1$ $C_{n-1} = dQ_{n-1} + R_{n-1}$ $C_n = dQ_n + R_n$ $C_0 + C_1 + C_{n-1} + C_n = d(Q_0 + Q_1 + Q_{n-1} + Q_n) + R_0 + R_1 + R_{n-1} + R_n$ $N = d(Q_0 + Q_1 + Q_{n-1} + Q_n) + R_0 + R_1 + R_{n-1} + R_n$ $dQ + R = d(Q_0 + Q_1 + Q_{n-1} + Q_n) + R_0 + R_1 + R_{n-1} + R_n$ By equating like parts:

$dQ = d(Q_0 + Q_1 + \ldots + Q_{n-1} + Q_n)$ $R = R_0 + R_1 + R_{n-1} + R_n$

Figure 1:
FIG. 1 represents an ATM cell header including a 32 bit address and an 8 bit Header Error Code (HEC).

FIG. 1 represents an ATM header including a 32 bit address and an 8 bit Header Error Code (HEC). For the ATM header the cyclic generator polynomial is $G(x) = X^8 + X^2 + X + 1$, which can be represented in modulo 2 (base 2) as 100000111. Applying the above theorem to a 32 bit integer the remainders (syndromes) for each power of two can be calculated as follows. Note that bit 31 is the most significant bit and bit 0 is the least significant bit.

$R_{31} = R[X^{31}/X^8 + X^2 + X + 1]$ $R_{30} = R[X^{30}/X^8 + X^2 + X + 1]$ $R_{29} = R[X^{29}/X^8 + X^2 + X + 1]$

•

•

•

$R_1 = R[X^1/X^8 + X^2 + X + 1]$ $R_0 = R[X^0/X^8 + X^2 + X + 1]$

Which can be computed as (note: the, 00000000 is G(X) multiplied by $X^8$ so that the remainder can be calculated).
$R_{31}$=R(10000000000000000000000000000000,00000000]/
[ 1 0 0 0 0 0 1 1 1 ] R $_3$ $_0$ = R (01000000000000000000000000000000,00000000]/
[100000111]$R_1$=R(00000000000000000000000000000010, 0 0 0 0 0 0 0 0 ] / [ 1 0 0 0 0 0 1 1 1 ] R $_0$ = R (00000000000000000000000000000001,00000000]/ [100000111]

Since there are 32 bits in the divisor for the ATM header there will be 32 remainders. These can be arranged as an array where P[O]=remainder for bit 0,P[1]=remainder for bit 1 . . . P[31]=remainder for bit 31.

The hexadecimal remainders of $C/(X^8+X^2+X+1)$ for each power of N is given in the following table:

|    | 0      | 1      | 2      | 3      | 4      | 5      | 6      | 7      |
|----|--------|--------|--------|--------|--------|--------|--------|--------|
| 0  | 0 × 07 | 0 × 0E | 0 × 1C | 0 × 38 | 0 × 70 | 0 × E0 | 0 × C7 | 0 × 89 |
| 8  | 0 × 15 | 0 × 2A | 0 × 54 | 0 × A8 | 0 × 57 | 0 × AE | 0 × 5B | 0 × B6 |
| 16 | 0 × 6B | 0 × D6 | 0 × AB | 0 × 51 | 0 × A2 | 0 × 43 | 0 × 86 | 0 × 0B |
| 24 | 0 × 16 | 0 × 2C | 0 × 58 | 0 × B0 | 0 × 67 | 0 × CE | 0 × 9B | 0 × 31 |

From this table one can calculate the HEC for any 32 bit ATM header. This is accomplished by simply adding together modulo 2 (exclusive OR) the remainders for each bit in the ATM header. Examples:

ATM Header=0×00000000 R=0 HEC=0
ATM Header=0×00000001
$R_0$=0×07 HEC=$R_0$=0×07
ATM Header=0×00000003
$R_0$=0×07
$R_1$=0×0E
HEC=$R_0$+$R_1$=0×09

Figure 2:
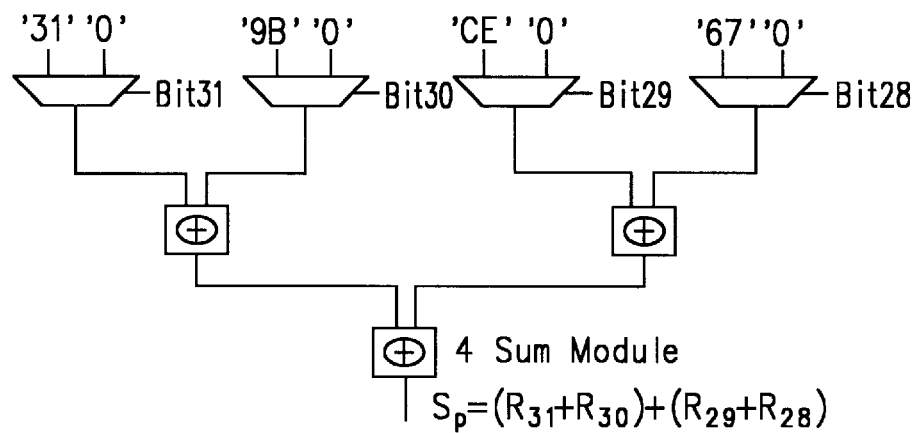
FIG. 2 is a schematic of a circuit for summing remainders for 4 bits of a binary integer including a plurality of exclusive OR gates.
Figure 3:
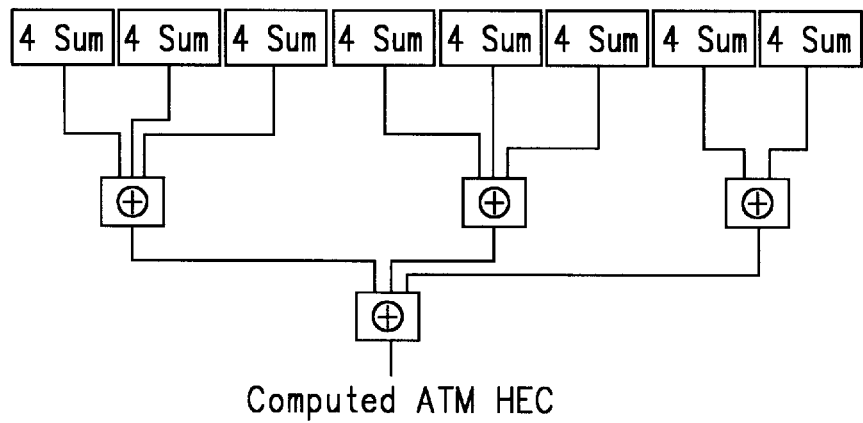
FIG. 3 is a schematic of a circuit for summing the outputs of circuits of FIG. 2.

FIG. 2 is a schematic of a 4 byte summation module for bits 31, 30, 29, and 28 which are the first most significant bits in the ATM header. If a bit is "1" the element selected is the value in the array which corresponds to the partial HEC for that bit. If the bit is "0" then "0" is selected. The + sign indicates modulo 2 addition (exclusive OR). The schematic of FIG. 3 shows the summation of each group of four bits in the ATM header. Each module (4Sum) performs the partial sum computation for bits 31–28, 27–24, 23–20, 19–16, 15–12, 11–8, 7–4, and 3–0 of the ATM header. This example does not show the addition of the ATM coset value (Hex 55) to the computed HEC. This addition is done by simply adding $55_{16}$ to the HEC using modulo 2 arithmetic.

From the remainder summation, supra, the HEC field is calculated as the sum of the remainders. This can also be used to determine which single bit in the header is in error if the calculated HEC does not equal the received HEC of the ATM header.

$$\begin{aligned}HEC = \ & R_{31}+R_{30}+R_{28}+R_{27}+R_{26}+R_{25}+R_{24}+ \\ & R_{23}+R_{22}+R_{21}+R_{20}+R_{19}+R_{18}+R_{17}+R_{16}+ \\ & R_{15}+R_{14}+R_{13}+R_{12}+R_{11}+R_{10}+R_9+R_8+ \\ & R_7+R_6+R_5+R_4+R_3+R_2+R_1+R_0\end{aligned}$$

Assume a single bit error in bit 21 occurs in the received header:

$$\begin{aligned}S_{received} = \ & R_{31}+R_{30}+R_{28}+R_{27}+R_{26}+R_{25}+R_{24}+ \\ & R_{23}+R_{22}+R_{21error}+R_{20}+R_{19}+R_{18}+R_{17}+R_{16}+ \\ & R_{15}+R_{14}+R_{13}+R_{12}+R_{11}+R_{10}+R_9+R_8+ \\ & R_7+R_6+R_5+R_4+R_3+R_2+R_1+R_0\end{aligned}$$

Subtracting $S_{received}$ from the HEC will be zero for each remainder that is equal, but not equal to zero for $R_{21}$ and $R_{21error}$. This results in:

HEC-$S_{received}$=$R_{21}$-$R_{21error}$

Since either $R_{21}$ or $R_{21error}$ is a "0", the remainder value will be one of the value of $R_{21}$, 0×43 in the remainder table, and index of array element $R_{21}$ indicates which bit is in error. This is true because each bit of the computed HEC is by definition an element of the remainder table. So the difference of the remainders will be the partial HEC by which they differ. By complementing the selected bit the header will be corrected.

If two or more errors are present, subtracting the new cyclic code from the transmitted code will give a value indicating an error, but the specific errors cannot be identified. In this case the transmitted data must be discarded.

Figure 4:
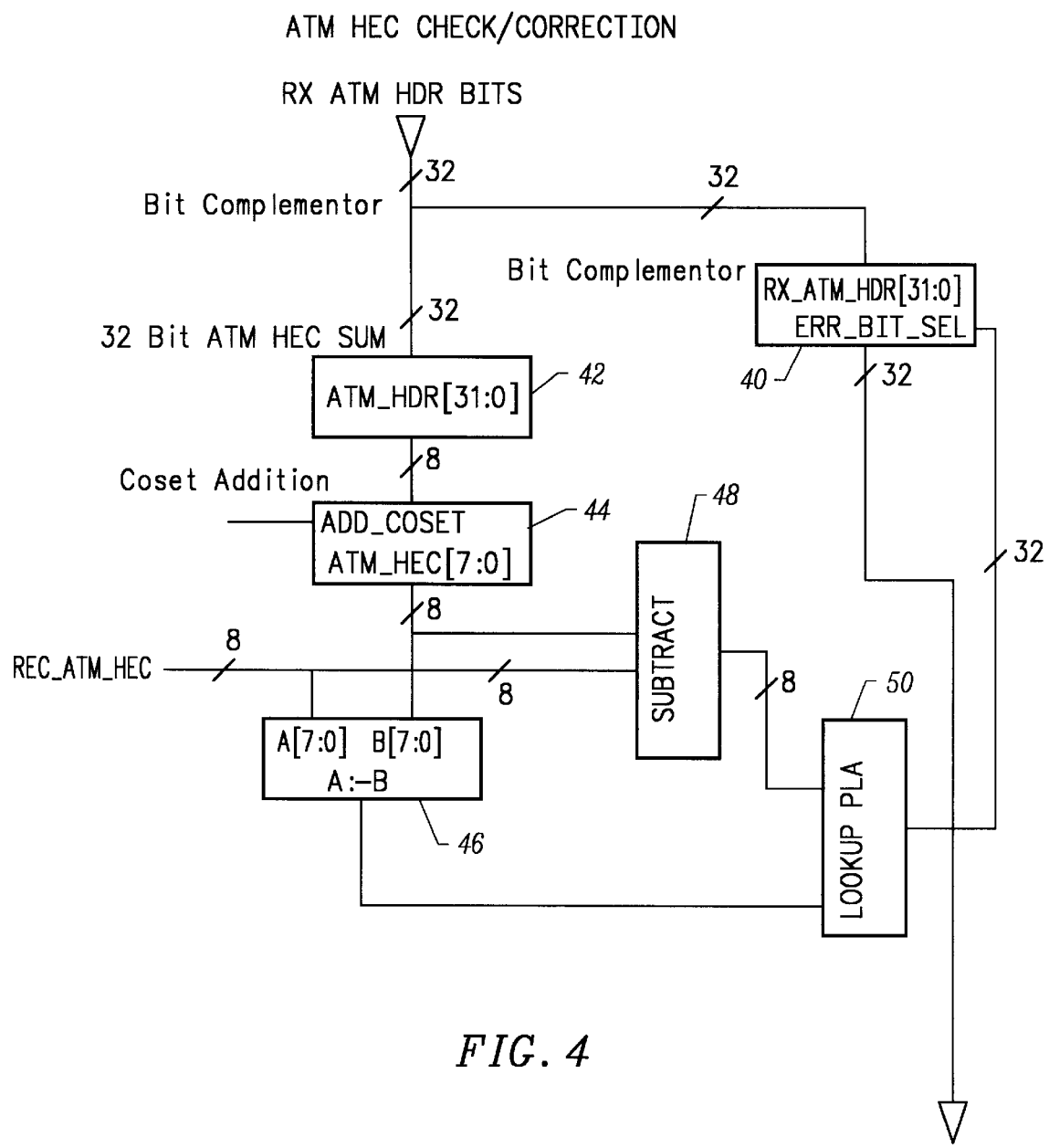
FIG. 4 is a flow diagram of cyclic code generation, error detection, and error correction in accordance with the invention.

FIG. 4 is a flow diagram for the process including bit complementor 40 for an identified erroneous bit, 32 bit ATM Header (31:0) as received at 42, the calculated HEC for the received Header at 44, the comparison of the 8 bit received HEC with the 8 bit calculated HEC at 46, subtractor 48 for identifying a remainder error, and lookup PLA 50 for identifying an erroneous bit from the remainder error. The lookup PLA 50 then activates bit complementor 40 as the received ATM Header is recycled for error correction.

While the invention has been described with references to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of check bits generation for a binary integer of an asynchronous transfer mode (ATM) header comprising the steps of
   a) obtaining a remainder value for each bit resulting from dividing said integer by a cyclic code generator polynomial to obtain a quotient and said remainder for each bit, and
   b) summing all remainder values modulo 2 to obtain an integer remainder, said integer remainder functioning as check bits for said header.
2. The method as defined by claim 1 and further including identifying an error in a received header from the received check bits comprising the steps of:
   c) repeating steps a) and b) for said received integer to obtain new check bits,
   d) obtaining the difference between said new check bits and said received check bits, and
   e) using any difference as a remainder in identifying a bit having a corresponding remainder as an error bit.
3. The method as defined by claim 2 and further including
   f) reversing said error bit.
4. The method as defined by claim 1 wherein step b) includes applying bit remainders through exclusive OR gates.
5. The method as defined by claim 4 wherein
   step a) includes storing remainder values for all bits of a header having all "1" bits, and
   step b) includes summing stored remainder values for each "1" bit of said header.
6. The method as defined by claim 4 and further including identifying an error in a received header comprising the steps of:
   c) repeating steps a) and b) for said received header to obtain new check bits,
   d) obtaining the difference between said new check bits and said received check bits, and e) using any difference as a remainder in identifying a bit having a corresponding remainder as an error bit.

7. The method is defined by claim 6 and further including f) reversing said error bit.

8. Apparatus for generating check bits for an asynchronous transfer mode (ATM) header comprising a) means for obtaining a remainder value for each bit resulting from dividing said header by a cyclic regenerator polynomial to obtain a quotient and said remainder for each bit, and b) means for summing all remainders modulo 2 to obtain an integer remainder, said integer remainder functioning as check bits for said header.

9. Apparatus as defined by claim 8 wherein said means for summing includes a plurality of exclusive OR gates.

10. Apparatus is defined by claim 9 and further including means for identifying an error in a received header including c) a means for obtaining a remainder value for each bit resulting from dividing said received header by said cyclic generator polynomial to obtain a quotient and said remainder for each bit, d) means for obtaining the difference between said new check bits and said received check bits, and e) means using any difference as a remainder in identifying a bit having a corresponding remainder as an error bit.

11. Apparatus as defined by claim 10 further including means for complementing said error bit.

12. Apparatus as defined by claim 11 wherein said means for obtaining a remainder value for each bit includes a memory for storing remainder values for all bits of a maximum header, and said means for summing sums stored remainder values for each "1" bit of header.

* * * * *